(12) United States Patent
Kim et al.

(10) Patent No.: US 12,464,905 B2
(45) Date of Patent: Nov. 4, 2025

(54) DISPLAY APPARATUS AND METHOD OF MANUFACTURING THE SAME

(71) Applicant: Samsung Display Co., Ltd., Yongin-Si (KR)

(72) Inventors: Hyojung Kim, Yongin-si (KR);
Sangsub Kim, Yongin-si (KR);
Jongwoo Park, Yongin-si (KR);
Junehwan Kim, Yongin-si (KR);
Taeyoung Kim, Yongin-si (KR);
Youngtae Choi, Yongin-si (KR);
Hyuncheol Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 362 days.

(21) Appl. No.: 17/991,866

(22) Filed: Nov. 22, 2022

(65) Prior Publication Data
US 2023/0165071 A1    May 25, 2023

(30) Foreign Application Priority Data

Nov. 22, 2021   (KR) ........................ 10-2021-0161489

(51) Int. Cl.
*H10K 59/125*    (2023.01)
*H10K 10/46*    (2023.01)
(Continued)

(52) U.S. Cl.
CPC ......... *H10K 59/125* (2023.02); *H10K 10/462* (2023.02); *H10K 71/00* (2023.02);
(Continued)

(58) Field of Classification Search
None
See application file for complete search history.

(56) References Cited

U.S. PATENT DOCUMENTS 10,937,962 B2    3/2021    Kim et al.
11,315,955 B2    4/2022    Lee et al.

FOREIGN PATENT DOCUMENTS

CN    100999388 A    7/2007
CN    104485276 A    4/2015
(Continued)

OTHER PUBLICATIONS

S.Arunprathap et al., "Fabrication Of Thin Film Transistor Using High K Dielectric Materials", International Journal Of Engineering And Computer Science, ISSN:2319-7242 vol. 3 Issue 4 Apr. 2014, pp. 5387-5391.

(Continued)

*Primary Examiner* — Anthony Ho
(74) *Attorney, Agent, or Firm* — Innovation Counsel LLP (57) ABSTRACT

The invention provides a display apparatus and a method for manufacturing the same. The display apparatus includes a substrate and a thin-film transistor. The thin-film transistor includes a semiconductor layer disposed on the substrate and includes a gate electrode overlapping the semiconductor layer and insulated from the semiconductor layer. The semiconductor layer includes a polysilicon layer and an organic layer. The polysilicon layer has a first surface and has an uneven surface overlapping the first surface. The organic layer is disposed on the uneven surface of polysilicon layer and includes an organic semiconductor material.

10 Claims, 7 Drawing Sheets

(51) Int. Cl.
*H10K 71/00* (2023.01)
*H10K 85/10* (2023.01)
*H10K 85/40* (2023.01)
*H10K 59/12* (2023.01)

(52) U.S. Cl.
CPC ......... *H10K 85/1135* (2023.02); *H10K 85/40* (2023.02); *H10K 59/1201* (2023.02)

(56) References Cited

FOREIGN PATENT DOCUMENTS

| | | |
|---|---|---|
| JP | H02-185019 A | 7/1990 |
| JP | 2010123926 A | 6/2010 |
| KR | 10-0259166 B1 | 6/2000 |
| KR | 10-0542982 B1 | 1/2006 |
| KR | 10-0701091 B1 | 3/2007 |
| KR | 101918851 B1 | 11/2018 |
| KR | 1020190107247 A | 9/2019 |

OTHER PUBLICATIONS

Junekyun Park et al., "Improvement of Quantum Dot Light Emitting Device Characteristics by CdSeZnS Blended with HMDS" Applied Sciences, MDPI, www.mdpi.com/journal/applsci, pp. 1-16.

J. Cyril Robinson Azariah et al., "Study of Electron Transport in Organic and Inorganic Atomic Monolayer Based MOSMOSFET", NEMS/MEMS and Nanolithography Lab, Department of Nanosciences and Technology, Karunya University, Coimbatore 641114. Email: devaprakasam@karunya.edu, pp. 1-8.

Thomas Boder et al., "Correlation of surface roughness and surface energy of silicon-based materials with their priming reactivity", Monatsh Chem (2012) 143: pp. 717-722.

FIG. 7

DISPLAY APPARATUS AND METHOD OF MANUFACTURING THE SAME

CROSS-REFERENCE TO RELATED APPLICATION

This application claims priority under 35 U.S.C. § 119 to Korean Patent Application No. 10-2021-0161489 filed on Nov. 22, 2021 in the Korean Intellectual Property Office; the Korean Patent Application is incorporated by reference.

BACKGROUND

1. Field

The technical field may relate to a display apparatus and a method for manufacturing the display apparatus.

2. Description of the Related Art

Display apparatuses may display images in response to input signals. Display apparatuses may be included in various electronic devices for various uses. An ideal display apparatus may display images with satisfactory quality, may have strong resistance to impact, and/or may have excellent portability.

SUMMARY

One or more embodiments may be related to a display apparatus including a high-quality thin-film transistor.

According to one or more embodiments, a display apparatus includes a substrate, and a thin-film transistor including a semiconductor layer disposed on the substrate and a gate electrode at least partially overlapping the semiconductor layer and insulated from the semiconductor layer, wherein the semiconductor layer includes a polysilicon layer, and an organic layer disposed on the polysilicon layer and including an organic semiconductor material, wherein an upper surface of the polysilicon layer has an uneven structure, wherein the organic layer is disposed on a portion of the uneven structure.

An embodiment may be related to a display apparatus. The display apparatus may include a substrate and a thin-film transistor. The thin-film transistor may include a semiconductor layer that overlaps the substrate and may include a gate electrode that overlaps the semiconductor layer and is insulated from the semiconductor layer. The semiconductor layer may include a polysilicon layer and an organic layer. The polysilicon layer may have a first surface and may have an uneven surface that overlaps the first surface. The organic layer may be disposed on the uneven surface and may include an organic semiconductor material.

The organic semiconductor material may include at least one of hexamethyldisilazane (HMDS) and poly(3,4-ethylenedioxythiophene):poly(styrenesulfonate) (PEDOT:PSS).

A flat surface portion of the organic layer may overlap a convex portion (or protrusion) of the uneven surface.

The uneven surface may include convex portions and may include concave portions arranged between the convex portions. The organic layer may fill the concave portions.

The organic layer may partially expose at least some of the plurality of convex portions.

At least some of the convex portions may protrude beyond the organic layer.

The surface roughness of the first surface of the polysilicon layer may be less than the surface roughness of the uneven surface of the polysilicon layer.

The surface roughness of a surface of the semiconductor layer may be less than the surface roughness of the uneven surface of the polysilicon layer.

The surface roughness (RMS) of a surface of the semiconductor layer may be less than 5 nm. The uneven surface of the polysilicon layer may be at least partially positioned between the surface of the organic layer and the first surface of the polysilicon layer.

An average thickness of the organic layer may be in a range of 50 nm to 120 nm.

The display apparatus may include an organic light-emitting diode electrically connected to the thin-film transistor.

The organic light-emitting diode may include a pixel electrode, an opposite electrode, and an emission layer between the pixel electrode and the opposite electrode.

An embodiment may be related to a method for manufacturing a display apparatus. The method may include the following steps: forming a semiconductor layer that overlaps a substrate; forming an insulating layer on the semiconductor layer; and forming a gate electrode that overlaps the semiconductor layer and is electrically insulated from the semiconductor layer by the insulating layer. The forming of the semiconductor layer may include the following steps: forming a polysilicon layer having a first surface and having an uneven surface that overlaps the first surface; and forming an organic layer on the uneven surface. The organic layer may include an organic semiconductor material.

The forming of the polysilicon layer may include the following steps: forming an amorphous silicon layer on the substrate; and crystallizing the amorphous silicon layer.

The organic semiconductor material may include at least one of hexamethyldisilazane (HMDS) and poly(3,4-ethylenedioxythiophene):poly(styrenesulfonate) (PEDOT:PSS).

The forming of the organic layer may include the following steps: coating the uneven surface with a solution that includes the organic semiconductor material; and heat-treating the solution after the coating.

The coating may be performed by spin coating or high-pressure spraying.

The spin coating may be performed at a speed in a range of 700 rpm to 1300 rpm.

The uneven surface of the polysilicon layer may include convex portions and concave portions arranged between the convex portions. The organic layer may fill the concave portions and may partially expose at least some of the convex portions.

The heat-treating may be performed at a temperature in a range of 250° C. to 350° C.

The surface roughness (RMS) of a surface of the semiconductor layer may be less than 5 nm.

An average thickness of the organic layer may be in a range of 50 nm to 120 nm.

DETAILED DESCRIPTION

Examples of embodiments are described with reference to the accompanying drawings, wherein like reference numerals may refer to like elements. Practical embodiments may have different forms and should not be construed as being limited to the described embodiments. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Although the terms "first," "second," etc. may be used to describe various elements, the elements should not be limited by the terms. The terms may be used to distinguish one element from another. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The singular forms "a," "an," and "the" may indicate the plural forms as well, unless the context clearly indicates otherwise.

The terms "include," "comprise," and "have" may specify the presence of stated features or elements but may not preclude the addition of one or more other features or elements.

When a first element is referred to as being on a second element, the first element may be directly or indirectly on the second element. Zero, one, or more intervening elements may be present between the first element and the second element.

Dimensions of elements in the drawings may be exaggerated or reduced for convenience of explanation and may not limit embodiments.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "include" or "comprise" may mean "be made of." The term "adjacent" may mean "immediately adjacent." The expression that an element extends in a particular direction may mean that the element extends lengthwise in the particular direction and/or that the lengthwise direction of the element is in the particular direction. The term "overlap" may be equivalent to "be overlapped by." The expression that a first element overlaps with a second element in a plan view may mean that the first element overlaps the second element in direction perpendicular to a substrate. A thickness may be in a direction perpendicular to a substrate. A height may be with reference to a substrate. The terms "lower" and "upper" may be relative to a substrate. The expression "of (about) A to (about) B" may mean "in a range of A to B."

In the following disclosure, the phrase "in a plan view" indicates that a portion of a target object is seen from above, and the phrase "in a cross-sectional view" indicates that a portion of a target object is vertically cut and the cross-section is viewed from the side. In the following disclosure, the term "overlap" covers overlapping "in a plan view" and "in a cross-sectional view".

One or more embodiments will be described below in more detail with reference to the accompanying drawings. Those elements that are the same or are in correspondence with each other are rendered the same reference numeral regardless of the figure number.

Figure 1:
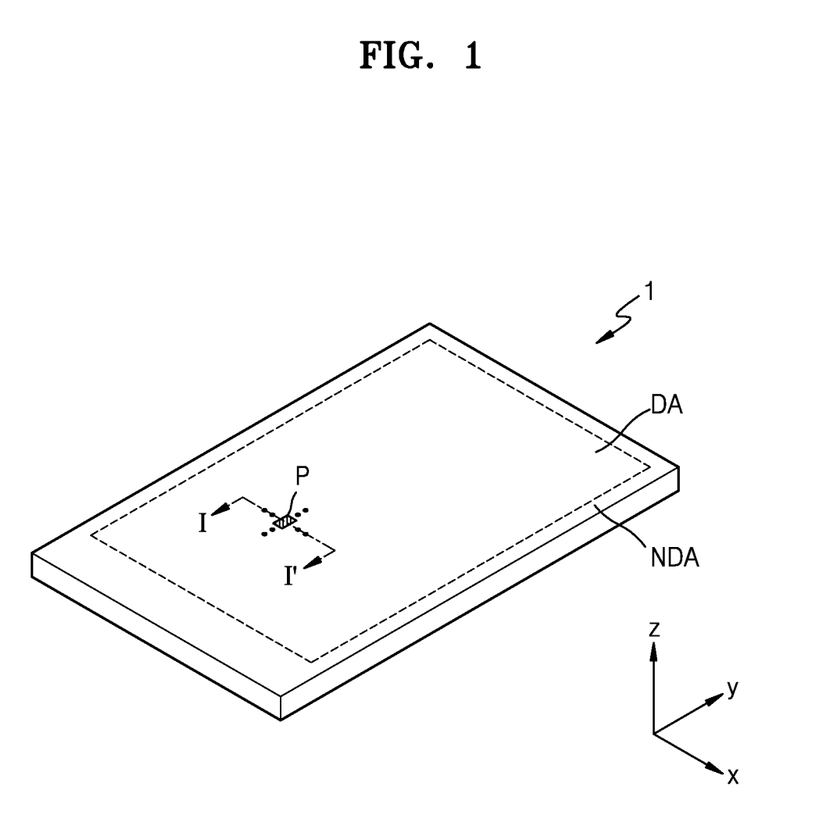
FIG. 1 is a schematic perspective view of a display apparatus according to an embodiment.

FIG. 1 is a schematic perspective view of a display apparatus 1 according to an embodiment.

Referring to FIG. 1, the display apparatus 1 may include a display area DA and a non-display area NDA arranged around the display area DA. The non-display area NDA may surround the display area DA. The display apparatus 1 may display an image using light emitted from a plurality of sub-pixels P arranged in the display area DA. The non-display area NDA may not include sub-pixels for. Edges of the display apparatus 1 may extend in the x direction (or X direction), the y direction (or Y direction), and/or z direction (or Z direction).

Although an organic light-emitting display apparatus is described below as an example of the display apparatus 1, the display apparatus 1 may be an inorganic light-emitting display apparatus, an inorganic electroluminescent (EL) display apparatus, or a quantum dot light-emitting display apparatus. An emission layer of a display element provided in the display apparatus 1 may include an organic material, an inorganic material, and/or quantum dots.

The display apparatus 1 may include a flat display surface, a stereoscopic display surface, and/or a curved display surface.

When the display apparatus 1 includes a stereoscopic display surface, the display apparatus 1 may include display areas oriented in different directions. The display apparatus 1 may include a polygonal columnar display surface. When the display apparatus 1 includes a curved display surface, the display apparatus 1 may be flexible, foldable, and/or rollable.

The display apparatus 1 may be applicable to a mobile phone terminal. Although not shown, electronic modules, a camera module, a power module, and the like mounted on a mainboard may be arranged together with the display apparatus 1 in a bracket/case, etc. to constitute a mobile phone terminal. The display apparatus 1 may be applied to televisions, monitors, tablet personal computers, vehicle navigation systems, game consoles, and/or smart watches.

The display area DA of the display apparatus 1 may have a shape of a circle, an oval, and/or a polygon, such as a triangle, a quadrilateral, and/or a pentagon.

The display apparatus 1 includes sub-pixels P arranged in the display area DA. Each of the sub-pixels P may include an organic light-emitting diode that may emit red, green, blue, or white light.

Figure 2:
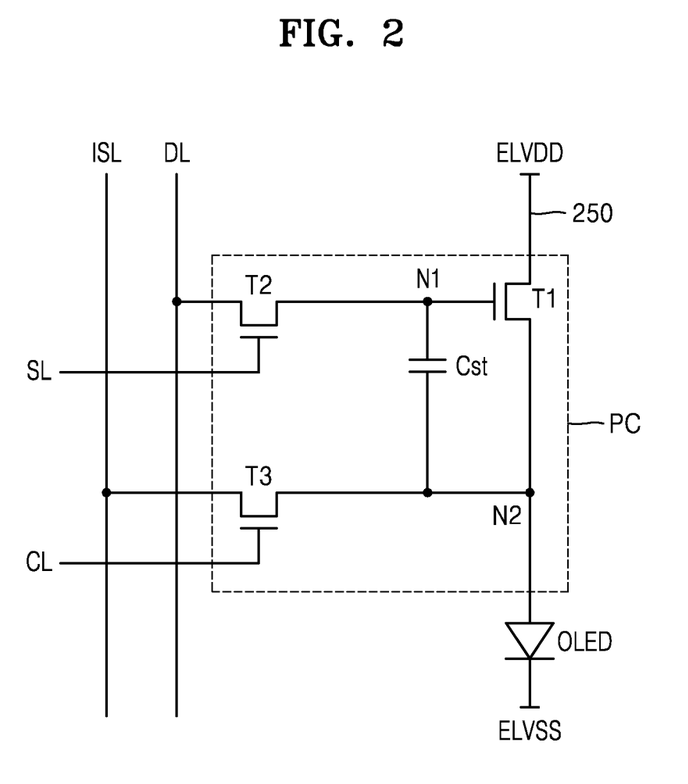
FIG. 2 is an equivalent circuit diagram of a sub-pixel that may be included in a display apparatus according to an embodiment.

FIG. 2 is an equivalent circuit diagram showing an organic light-emitting diode OLED and a sub-pixel circuit PC (electrically connected to the organic light-emitting diode OLED), which are included in a sub-pixel of a display apparatus according to an embodiment. The sub-pixel circuit PC may control emission of the organic light-emitting diode OLED.

The sub-pixel circuit PC may control an amount of current flowing from a driving voltage ELVDD to a common voltage ELVSS via the organic light-emitting diode OLED in response to a data signal. The sub-pixel circuit PC may include thin-film transistors T1, T2, and T3 and a storage capacitor Cst. The first thin-film transistor T1 may be a driving thin-film transistor, and the second and third thin-film transistors T2 and T3 may be switching thin-film transistors.

Each of the first thin-film transistor T1, the second thin-film transistor T2, and the third thin-film transistor T3 may be an oxide semiconductor transistor including a semiconductor layer composed of an oxide semiconductor, or may be a silicon semiconductor transistor including a semiconductor layer composed of polysilicon. Depending on the type of a thin-film transistor, a first electrode may be one of a source electrode and a drain electrode, and a second electrode may be the other one of a source electrode and a drain electrode.

A first electrode of the first thin-film transistor T1 may be connected to a driving voltage line 250 configured to supply the driving voltage ELVDD, and a second electrode of the first thin-film transistor T1 may be connected to a first electrode of the organic light-emitting diode OLED. A gate electrode of the first thin-film transistor T1 may be connected to a first node N1. The first thin-film transistor T1 may control an amount of current flowing through the organic light-emitting diode OLED from the driving voltage ELVDD in response to a voltage of the first node N1.

A first electrode of the second thin-film transistor T2 may be connected to a data line DL, and a second electrode of the second thin-film transistor T2 may be connected to the first node N1. A gate electrode of the second thin-film transistor T2 may be connected to a scan line SL. When a scan signal is supplied via the scan line SL, the second thin-film transistor T2 may be turned on to electrically connect the data line DL and the first node N1 to each other.

The third thin-film transistor T3 may be an initialization thin-film transistor and/or a sensing thin-film transistor. A first electrode of the third thin-film transistor T3 may be connected to a second node N2, and a second electrode of the third thin-film transistor T3 may be connected to a sensing line ISL. A gate electrode of the third thin-film transistor T3 may be connected to a control line CL.

The storage capacitor Cst may be connected between the first node N1 and the second node N2. A first capacitor electrode of the storage capacitor Cst may be connected to the gate electrode of the first thin-film transistor T1, and a second capacitor electrode of the storage capacitor Cst may be connected to the first electrode of the organic light-emitting diode OLED.

Although the first thin-film transistor T1, the second thin-film transistor T2, and the third thin-film transistor T3 are shown as NMOS transistors in FIG. 2, at least one of the first thin-film transistor T1, the second thin-film transistor T2, and the third thin-film transistor T3 may be a PMOS transistor.

Although FIG. 2 shows three thin-film transistors, the sub-pixel circuit PC may include four or more transistors.

At least one thin-film transistor including a silicon semiconductor from among the first thin-film transistor T1, which is a driving thin-film transistor, and switching thin-film transistors, for example, the second thin-film transistors T2 and third thin-film transistors and T3, may be manufactured during a process to be described below.

FIGS. 3, 4, 5, and 6 are schematic cross-sectional views of structures formed in a method for manufacturing a display apparatus according to one or more embodiments. Referring to FIG. 7, a thin-film transistor TFT of the display apparatus may include a semiconductor layer 120 and a gate electrode GE.

With reference to FIGS. 3 to 6, the method may include the following operations/steps: forming the semiconductor layer 120 on a substrate 100 and forming a first insulating layer 112 on the semiconductor layer 120. The operation of forming the semiconductor layer 120 may include the following operations/steps: forming a polysilicon layer 121 having a substantially even/flat surface and an uneven structure 122 (or uneven surface 122) that overlaps the substantially even/flat surface; and forming an organic layer 123 on the polysilicon layer 121. The organic layer 123 may include an organic semiconductor material.

Figure 3:
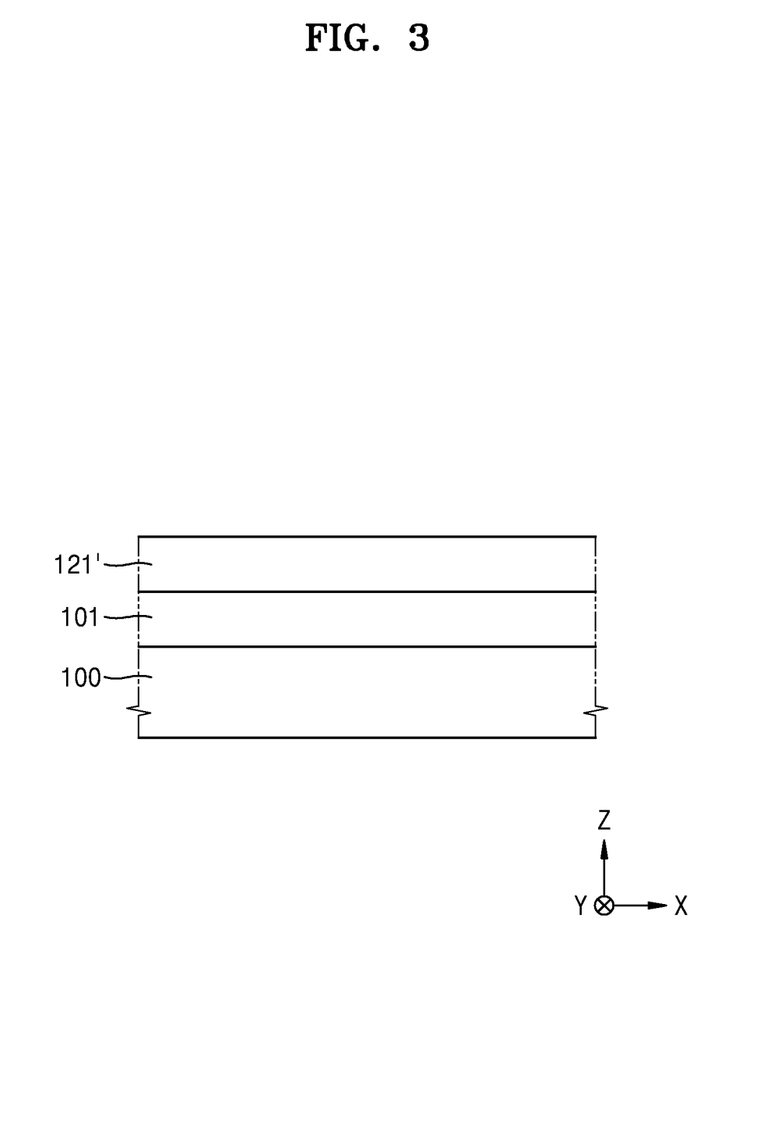
FIG. 3, FIG. 4, FIG. 5, and FIG. 6 are schematic cross-sectional views of structures formed in a method of manufacturing a display apparatus according to one or more embodiments.

Referring to FIG. 3, a buffer layer 101 may be formed on the substrate 100. The substrate 100 may include glass or may include polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 may have a multi-layer structure including a base layer including the above-described polymer resin and a barrier layer (not shown). The substrate 100 may be flexible, rollable and/or bendable.

The buffer layer 101 may decrease or prevent penetration of a foreign material, moisture, or outside air from outside the substrate 100 and may provide a flat surface on the substrate 100. The buffer layer 101 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide ($ZnO_x$, which may be ZnO and/or $ZnO_2$), and may have a single-layer or multi-layer structure.

An amorphous silicon (a-Si) layer 121' may be formed on the buffer layer 101. The a-Si layer 121' may be formed by low pressure chemical vapor deposition (LPCVD), atmospheric pressure chemical vapor deposition (APCVD), plasma enhanced chemical vapor deposition (PECVD), sputtering, vacuum deposition, or the like.

Figure 4:
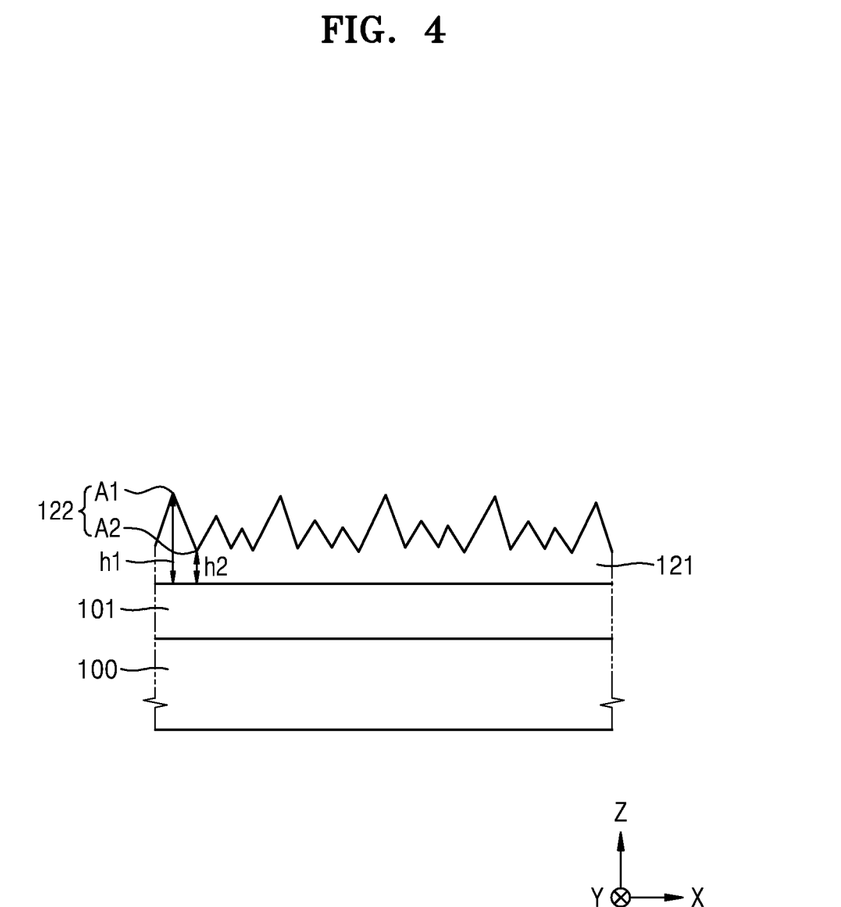

Referring to FIGS. 3 and 4, the a-Si layer 121' may be crystallized into the polysilicon layer 121. Amorphous silicon may be crystallized by laser beam irradiation or heat treatment. One or more of rapid thermal annealing (RTA), solid phase crystallization (SPC), excimer laser annealing (ELA), metal induced crystallization (MIC), metal induced lateral crystallization (MILC), sequential lateral solidification (SLS), etc. may be used to perform crystallization of the a-Si layer 121' into the polysilicon layer 121.

The a-Si layer 121' may be crystallized into the polysilicon layer 121 using an ELA method. The ELA method may be performed at a low temperature, and laser irradiation time is sufficient short at tens of nanoseconds (ns). Therefore, damage to the substrate 100 may be minimized. In the ELA method, amorphous silicon is partially melted using a laser and then solidifies over time to be crystallized. In the ELA method, the polysilicon layer 121 may be formed by scanning an excimer laser in the form of a line beam on the a-Si layer 121'.

During a process of crystallizing the a-Si layer 121' into the polysilicon layer 121, an uneven structure 122 may be formed on an upper surface of the polysilicon layer 121 due to differences in the sizes of laser beams, the scan intervals, and the size of grains subjected to crystal growth.

The uneven structure 122 (or uneven surface 122) may include a plurality of convex portions A1 (or protrusions A1) and a plurality of concave portions A2 (or recesses A2).

The convex portions A1 and the concave portions A2 may have irregular shapes and may occur at irregular intervals. A convex portion A1 and/or a concave portion A2 may have a conical shape, and/or a cuboid shape, and/or a cubic shape. The convex portion A1 may protrude upward from a surface of the polysilicon layer 121 and may have a sharp upper end. The concave portion A2 may be depressed downward from a surface of the polysilicon layer 121 and may have a sharp lower end.

A distance from an upper surface of the buffer layer 101 to a vertex of the uneven structure 122 of the polysilicon layer 121 may be in a range of 30 nm to 150 nm. The distance may be a distance h1 to a highest point (or vertex) of a convex portion A1 from the upper surface of the buffer layer 101. The distance may be a distance h2 to a lowest point (or vertex) of a concave portion A2 from the upper surface of the buffer layer 101.

Due to the uneven structure 122 of the polysilicon layer 121, surface roughness of the polysilicon layer 121 may increase, and charge mobility may decrease. The surface roughness may represent a difference between concave structures and convex structures of a surface. Given the uneven structure 122 of the polysilicon layer 121, gate oxide integration (GOI) characteristics of an insulating layer insulating the polysilicon layer 121 and an upper gate electrode from each other may deteriorate.

Figure 5:
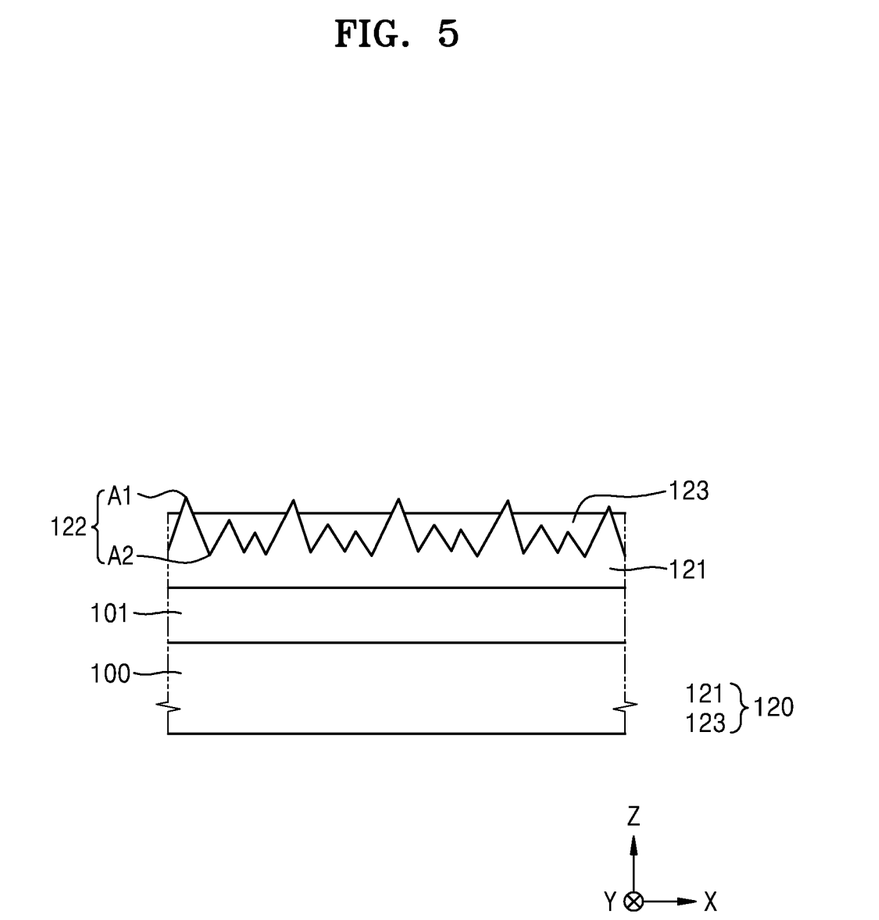

Referring to FIG. 5, the organic layer 123 may be formed on a portion of the uneven structure 122 of an upper surface of the polysilicon layer 121 to solve the above-mentioned problems caused by the uneven structure 122 and to reduce surface roughness. The semiconductor layer 120 may include the polysilicon layer 121 and the organic layer 123.

The organic layer 123 may include an organic semiconductor material. For example, the organic layer 123 (or the organic semiconductor material) may include at least one of hexamethyldisilazane (HMDS) and poly(3,4-ethylenedioxythiophene):poly(styrenesulfonate) (PEDOT:PSS). The organic layer 123 may include HMDS. The organic layer 123 may decrease surface roughness of the semiconductor layer 120 and may serve as a portion of the semiconductor layer 120.

The organic layer 123 may include HMDS. A band gap (Eg) of HMDS is about 2.45 eV, greater than a band gap of silicon (Si), which is about 1.12 eV. Thus, leakage current may decrease at an interface with the insulating layer. Advantageously, power consumption of a panel including the thin-film transistor TFT with the semiconductor layer 120 may decrease.

The organic layer 123 may be formed by coating the polysilicon layer 121 with a solution including an organic semiconductor material. For example, the coating may be performed by spin coating or high-pressure spraying. The organic layer 123 may be formed by spin coating, such that a coating solution including an organic semiconductor material may be substantially uniformly spread over the entire uneven structure 122 of the polysilicon layer 121 to have a substantially uniform thickness at the center and the periphery.

The spin coating may be performed at a rate of about 700 rpm to about 1300 rpm. The spin coating may be performed at a rate of about 900 rpm to about 1100 rpm. If the rate of the spin coating is less than about 700 rpm, an organic semiconductor material may not be uniformly spread over the uneven structure 122. If the rate of the spin coating is greater than about 1300 rpm, the centrifugal force is huge, such that too much of the organic semiconductor material may be pushed to the outside or spread excessively, causing difficulty in forming the organic layer 123 over the uneven structure 122 in a desired thickness.

The organic layer 123 may be formed by heat-treating the solution including an organic semiconductor material coated on the polysilicon layer 121. The heat treatment may remove a solvent included in the coating solution and may solidify the organic semiconductor material. When the organic layer 123 includes HMDS, the number of dangling bonds present on a surface of the polysilicon layer 121 may be decreased during the heat treatment process. Dangling bonds on a surface of the polysilicon layer 121 may combine with hydrogen, impurities, etc. to interfere with the flow of current when a device operates. As the number of dangling bonds decreases, charge mobility of the semiconductor layer 120 may increase, and surface roughness of the semiconductor layer 120 may decrease.

The heat treatment may be performed at a temperature of about 250° C. to about 350° C. The heat treatment may be performed at a temperature of about 300° C. to about 350° C. The heat treatment may be performed at a temperature of 300 oC for 20 minutes. If the heat treatment temperature is less than about 250° C. reaction between dangling bonds and HMDS is not activated at an interface between the polysilicon layer 121 and the organic layer 123; thus, charge mobility of the semiconductor layer 120 may not significantly improve. If the heat treatment temperature is greater than about 350° C. a layer located under the semiconductor layer 120, for example, the buffer layer 101 or the substrate 100, may be damaged due to hydrogen or heat.

The organic layer 123 may have flat surface portions over portions A1 and A2 of the uneven structure 122 (or uneven surface 122) of the polysilicon layer 121. The organic layer 123 may have an average thickness of about 50 nm to about 120 nm. If an average thickness of the organic layer 123 is less than about 50 nm, the improvement in surface roughness may be insignificant. If an average thickness of the organic layer 123 is greater than about 120 nm, there may be difficulties in forming the organic layer 123 by a coating method using a liquid material.

Referring to FIG. 5, the organic layer 123 may fill concave portions A2. The organic layer 123 may expose upper ends of at least some of the plurality of convex portions A1. The uneven surface 122 of the polysilicon layer 121 may be at least partially positioned between a surface of the organic layer 123 and the substantially even/flat surface of the polysilicon layer 121. The organic layer 123 may fill the concave portions A2 between the convex portions A1 in the uneven structure 122 of the polysilicon layer 121, such that the surface roughness of the semiconductor layer 120 may be reduced.

The organic layer 123 may be formed on a portion of the uneven structure 122 of the polysilicon layer 121 to decrease surface roughness of the semiconductor layer 120. The surface roughness of an upper surface of the semiconductor layer 120 including the organic layer 123 may be less than the surface roughness of an upper surface of the polysilicon layer 121. A degree of surface roughness may be calculated using at least one of an average calculation method (Ra), a root mean square calculation method (Rq, RMS), a maximum height calculation method (Rs), a ten-point average calculation method (Rz), etc. A value using the root mean square calculation method (Rq, RMS) may be used as a value of surface roughness. The surface roughness (RMS) of an upper surface of the semiconductor layer 120 including the organic layer 123 may be less than about 5 nm. The surface roughness (RMS) of an upper surface of the semiconductor layer 120 including the organic layer 123 may be less than about 4.6 nm.

Figure 6:
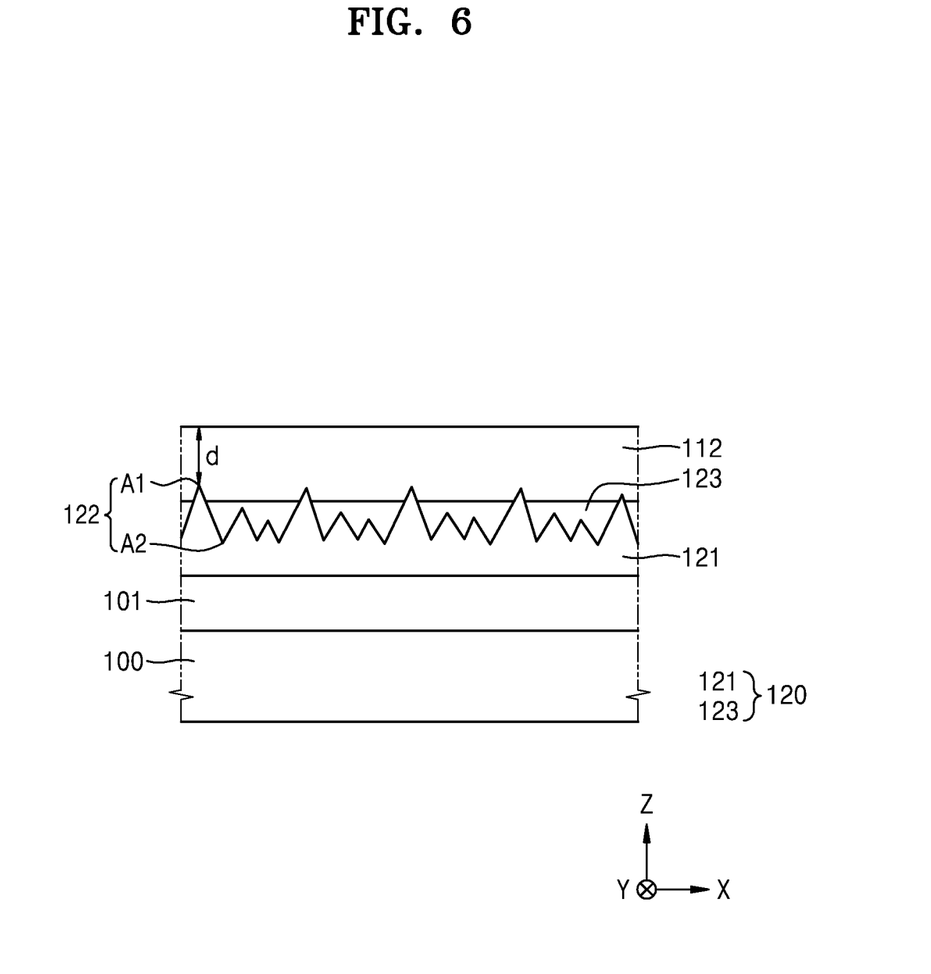
Figure 7:
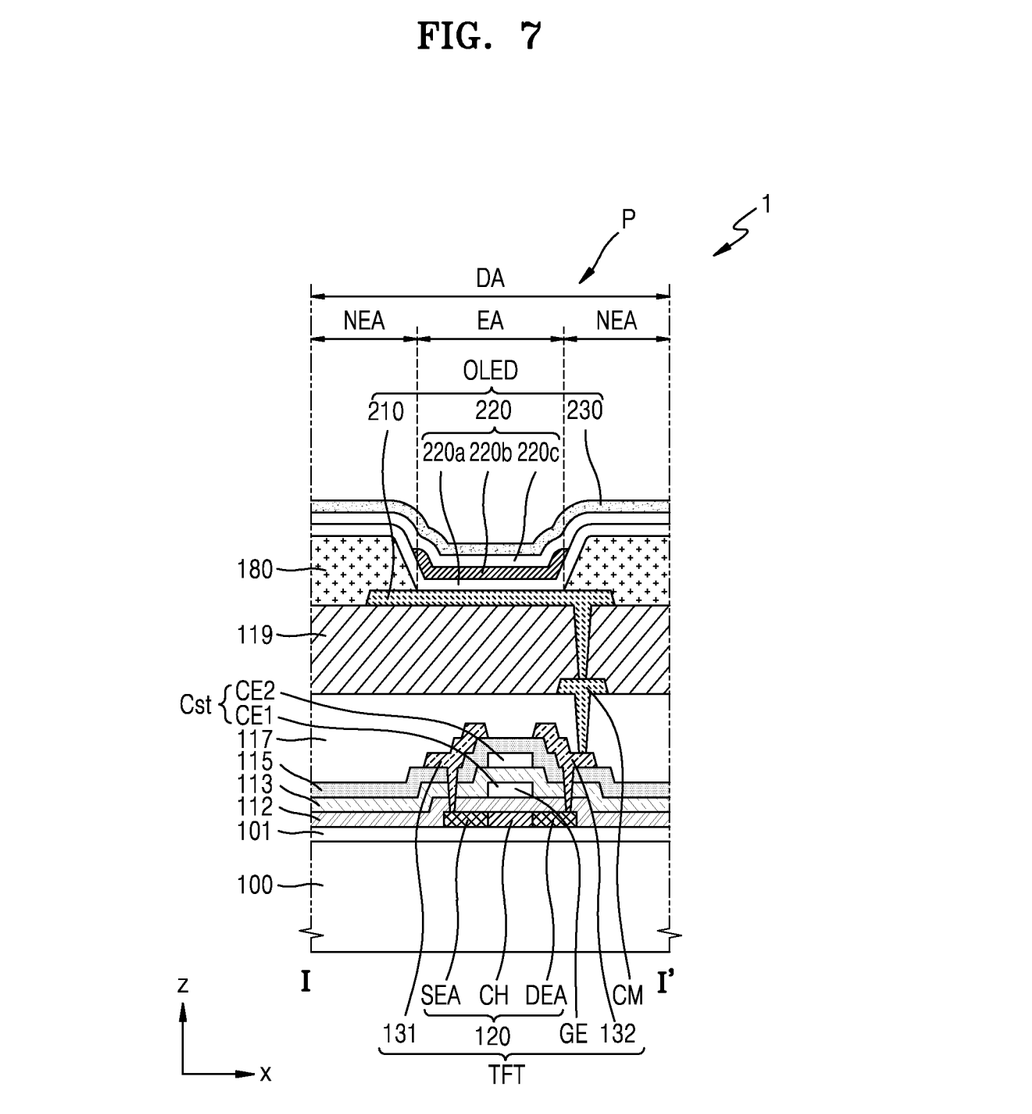
FIG. 7 is a schematic cross-sectional view of a display apparatus taken along a line I-I' indicated in FIG. 1 according to an embodiment.

Referring to FIG. 6, the first insulating layer 112 may be formed on the semiconductor layer 120. The first insulating layer 112 may include at least one inorganic insulating material, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$, which may be ZnO and/or $ZnO_2$). The first insulating layer 112 may have a single-layer or multi-layer structure. The first insulating layer 112 may include silicon dioxide ($SiO_2$).

The organic layer 123 fills the concave portion A2 of the polysilicon layer 121 and has a certain thickness. Given the same amount of inorganic insulating material, when the first insulating layer 112 is formed on the organic layer 123, an average thickness of the first insulating layer 112 may be increased compared to a case in which the first insulating layer 112 is directly formed on the polysilicon layer 121. A distance from the semiconductor layer 120 to an upper surface of the first insulating layer 112, for example, a distance d from an exposed convex portion A1 to an upper surface of the first insulating layer 112 may increase. Accordingly, GOI characteristics of the first insulating layer 112 insulating the semiconductor layer 120 and the gate electrode GE (of FIG. 7) from each other may improve. Advantageously, satisfactory reliability of the thin-film transistor TFT may be obtained.

FIG. 7 is a schematic cross-sectional view of the display apparatus 1 taken along the line I-I' indicated in FIG. 1 according to an embodiment.

Elements and structures described with reference to FIGS. 3 to 6 may be applied to the thin-film transistor TFT of FIG. 7.

The buffer layer 101 may be disposed on the substrate 100. The thin-film transistor TFT may be disposed on the buffer layer 101. In FIG. 7, the thin-film transistor TFT may be a driving thin-film transistor (for example, the first thin-film transistor T1 of FIG. 2) or a switching thin-film transistor (e.g., the second thin-film transistor T2 or third thin-film transistor T3 of FIG. 2). The thin-film transistor TFT may include the semiconductor layer 120, the gate electrode GE overlapping the semiconductor layer 120, and electrodes 131 and 132 electrically connected to the semiconductor layer 120. The thin-film transistor TFT may be connected to the organic light-emitting diode OLED to drive the organic light-emitting diode OLED.

The semiconductor layer 120 may include a silicon semiconductor. The semiconductor layer 120 may include polysilicon obtained by crystallizing amorphous silicon. The semiconductor layer 120 may include the polysilicon layer 121 of FIG. 4 and the organic layer 123 of FIG. 5 manufactured through the manufacturing method described with reference to FIGS. 3 to 6.

The semiconductor layer 120 may include a channel region CH overlapping the gate electrode GE, and may include a source region SEA and a drain region DEA arranged on opposite sides of the channel region CH and having a higher impurity concentration than that of the channel region CH. The impurity may include an N-type impurity or a P-type impurity. The source region SEA and the drain region DEA may be electrically connected to the source electrode 131 and the drain electrode 132, respectively.

The first insulating layer 112 may be disposed on the semiconductor layer 120. The gate electrode GE may be disposed on the first insulating layer 112. The first insulating layer 112 may insulate the semiconductor layer 120 and the gate electrode GE from each other. The gate electrode GE may overlap the channel region CH of the semiconductor layer 120. The gate electrode GE may include one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single layer or multiple layers.

A second insulating layer 113 may cover the gate electrode GE and the first insulating layer 112. Like the first insulating layer 112, the second insulating layer 113 may include at least one inorganic insulating material, such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO). The second insulating layer 113 may have a single-layer or multi-layer structure.

A storage capacitor Cst may be disposed on the first insulating layer 112. The storage capacitor Cst may include a first electrode CE1, and may include a second electrode CE2 overlapping the first electrode CE1. The second insulating layer 113 may be disposed between the first electrode CE1 and the second electrode CE2.

The second electrode CE2 of the storage capacitor Cst may overlap the gate electrode GE of the thin-film transistor TFT, and the first electrode CE1 of the storage capacitor Cst may be integrally provided with the gate electrode GE of the thin-film transistor TFT. The first electrode CE1 of the storage capacitor Cst may be spaced from the gate electrode GE of the thin-film transistor TFT and disposed on the first insulating layer 112.

The second electrode CE2 of the storage capacitor Cst may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and/or copper (Cu) and may have a single-layer or multi-layer structure.

A third insulating layer 115 may be disposed on the second electrode CE2 of the storage capacitor Cst. The third insulating layer 115 may include at least one inorganic insulating material, such as silicon oxide (SiOX), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnOx, which may be ZnO and/or $ZnO_2$). The third insulating layer 115 may have a single-layer or multi-layer structure.

A source electrode 131 and a drain electrode 132 may be disposed on the third insulating layer 115. The source electrode 131 and the drain electrode 132 may include a conductive material including at least one of molybdenum (Mo), aluminum (Al), copper (Cu), titanium (Ti), etc. and may include multiples layers or a single layer. The source electrode 131 and the drain electrode 132 may have a multi-layer structure of titanium (Ti)-aluminum (Al)-titanium (Ti).

A first planarization layer 117 may be disposed on the source electrode 131 and the drain electrode 132. The first planarization layer 117 may include, in a single layer or multiple layers, an organic material and/or an inorganic material. The first planarization layer 117 may include a general commercial polymer such as benzocyclobutene (BCB), polyimide (PI), hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend of some of the above polymers. The first planarization layer 117 may include silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$, which may be ZnO and/or $ZnO_2$).

A contact metal layer CM may be disposed on and in the first planarization layer 117. The contact metal layer CM may include at least one of aluminum (Al), copper (Cu), titanium (Ti), etc. and may include multiple layers or a single layer. The contact metal layer CM may have a multi-layer structure of titanium (Ti)-aluminum (Al)-titanium (Ti).

A second planarization layer 119 may be disposed on the contact metal layer CM. The second planarization layer 119 may include, in a single layer or multiple layers, an organic material and/or an inorganic material. The second planarization layer 119 may include a material different from that of the first planarization layer 117. The second planarization layer 119 may include the same material as that of the first planarization layer 117. After the second planarization layer 119 is formed, chemical mechanical polishing may be performed to provide a flat upper surface. The second planarization layer 119 may be optional.

The organic light-emitting diode OLED including a pixel electrode 210, an intermediate layer 220, and an opposite electrode 230 may be disposed on the second planarization layer 119. The pixel electrode 210 is electrically connected to the contact metal layer CM via a contact hole penetrating the second planarization layer 119, and the contact metal layer CM is electrically connected to the drain electrode 132 via a contact hole penetrating the first planarization layer 117, such that the organic light-emitting diode OLED may be electrically connected to the thin-film transistor TFT.

The pixel electrode 210 may be disposed on the second planarization layer 119. The pixel electrode 210 may be a (semi)transmissive electrode or a reflective electrode. The pixel electrode 210 may include a reflective film including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or a compound or alloy of one or more of the above metals. The pixel electrode 210 may include a transparent or semitransparent electrode layer on the reflective film. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). The pixel electrode 210 may have a stack structure of ITO-Ag-ITO.

A bank layer 180 may be disposed on the second planarization layer 119, and the bank layer 180 may have an opening exposing at least a portion of the pixel electrode 210. An area exposed by the opening of the bank layer 180 may be an emission area EA. A periphery of the emission area EA is a non-emission area NEA, and the non-emission area NEA may surround the emission area EA. The display area DA may include a plurality of emission areas EA and the non-emission area NEA surrounding the plurality of emission areas EA. The bank layer 180 may prevent an arc, etc. from occurring at the edge of the pixel electrode 210 by increasing a distance between the pixel electrode 210 and the opposite electrode 230 arranged above the pixel electrode 210. The bank layer 180 may be formed by spin coating, using an organic insulating material such as at least one of PI, polyamide, acrylic resin, BCB, HMDSO, phenolic resin, etc. A spacer (not shown) may be further disposed on the bank layer 180.

The intermediate layer 220 may be disposed on the portion of the pixel electrode 210 exposed by the bank layer 180. The intermediate layer 220 may include an emission layer 220b, and a first functional layer 220a and a second functional layer 220c may be optionally disposed under and on the emission layer 220b.

The emission layer 220b of the intermediate layer 220 may be disposed on the portion of the pixel electrode 210 exposed by the bank layer 180.

The first functional layer 220a may be disposed under the emission layer 220b, and the second functional layer 220c may be disposed on the emission layer 220b. The first functional layer 220a and the second functional layer 220c may each be an organic functional layer.

The first functional layer 220a may include a hole injection layer (HIL) and/or a hole transport layer (HTL), and the second functional layer 220c may include an electron transport layer (ETL) and/or an electron injection layer (EIL).

The emission layer 220b may include an organic material including a fluorescent or phosphorescent material that emits red, green, blue, or white light. The emission layer 220b may include a low-molecular weight organic material or a polymer organic material.

When the emission layer 220b includes a low-molecular weight organic material, the intermediate layer 220 may have a structure in which an HIL, an HTL, an emission layer 220b, an ETL, an EIL, etc. are stacked, and may include one or more low-molecular weight organic materials, such as one or more of copper phthalocyanine (CuPc), N,N'-Di (naphthalene-1-yl)-N,N'-diphenyl-benzidine (NPB), tris-8-hydroxyquinoline aluminum ($Alq_3$), etc.

When the emission layer 220b includes a polymer organic material, the intermediate layer 220 may have a structure including an HTL and an emission layer 220b. The HTL may include poly(3,4-ethylenedioxythiophene) (PEDOT), and the emission layer 220b may include a polymer material such as at least one of a polyphenylene vinylene (PPV)-based material, a polyfluorene-based material, etc. The emission layer 220b may be formed by screen printing, inkjet printing, laser induced thermal imaging (LITI), or the like.

The opposite electrode 230 may be disposed on the intermediate layer 220 and may cover the entire intermediate layer 220. The opposite electrode 230 may be arranged over the display area DA and may cover the entire display area DA. The opposite electrode 230 may be integrally formed over the entire display area DA using an open mask and may be shared by the sub-pixels P arranged in the display area DA.

The opposite electrode 230 may include a conductive material having a low work function. The opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy of some of the above metals. The opposite electrode 230 may include an ITO, IZO, ZnO, and/or $In_2O_3$ layer on the (semi)transparent layer.

The organic light-emitting diode OLED may be covered by a thin film encapsulation layer. The thin film encapsulation layer may include at least one inorganic encapsulation layer and at least one organic encapsulation layer. The organic light-emitting diode OLED may be covered by an encapsulation substrate.

According to embodiments, a layer including an organic semiconductor material may be arranged on an uneven surface of a polysilicon layer to reduce surface roughness of a semiconductor layer. Advantageously, charge mobility of the semiconductor layer may be increased, and the reliability of an associated thin-film transistor may be satisfactory.

The described embodiments should be considered in an illustrative sense and not for purposes of limitation. Descriptions of features or aspects within each embodiment should typically be considered as available for other similar features or aspects in other embodiments. While one or more embodiments have been described with reference to the figures, various changes in form and details may be made in in the described embodiments without departing from the scope defined by the following claims.

What is claimed is:

1. A display apparatus comprising:
    a substrate; and
    a thin-film transistor comprising a semiconductor layer disposed on the substrate and comprising a gate electrode that overlaps the semiconductor layer,
    wherein the semiconductor layer comprises:
    a polysilicon layer having a first surface and an uneven surface that overlaps the first surface; and
    an organic layer disposed on the uneven surface and comprising an organic semiconductor material.

2. The display apparatus of claim 1, wherein the organic semiconductor material comprises at least one of hexamethyldisilazane (HMDS) and poly(3,4-ethylenedioxythiophene):poly(styrenesulfonate) (PEDOT:PSS).

3. The display apparatus of claim 1, wherein the uneven surface of the polysilicon layer is at least partially positioned between a surface of the organic layer and the first surface of the polysilicon layer.

4. The display apparatus of claim 1, wherein the uneven surface comprises convex portions and comprises concave portions arranged between the convex portions, and wherein the organic layer fills the concave portions.

5. The display apparatus of claim 4, wherein the organic layer partially exposes at least some of the convex portions.

6. The display apparatus of claim 1, wherein surface roughness of a surface of the semiconductor layer is less than surface roughness of the uneven surface of the polysilicon layer.

7. The display apparatus of claim 1, wherein surface roughness of a surface of the semiconductor layer is less than 5 nm.

8. The display apparatus of claim 1, wherein an average thickness of the organic layer is in a range of 50 nm to 120 nm.

9. The display apparatus of claim 1, further comprising an organic light-emitting diode electrically connected to the thin-film transistor.

10. The display apparatus of claim 9, wherein the organic light-emitting diode comprises a pixel electrode, an opposite electrode, and an emission layer between the pixel electrode and the opposite electrode.

* * * * *